(12) United States Patent
Ting et al.

(10) Patent No.: US 6,237,115 B1
(45) Date of Patent: May 22, 2001

(54) DESIGN FOR TESTABILITY IN VERY HIGH SPEED MEMORY

(75) Inventors: Tah-Kang Joseph Ting, Hsinchu; Bor-Doou Rong, Chupei, both of (TW)

(73) Assignee: Etron Technology, Inc., Hsin-chu (TW)

( * ) Notice: Subject to any disclaimer, the term of this patent is extended or adjusted under 35 U.S.C. 154(b) by 0 days.

(21) Appl. No.: 09/263,541

(22) Filed: Mar. 8, 1999

(51) Int. Cl.[7] ................................................ G11C 29/00
(52) U.S. Cl. ............................................ 714/718; 365/201
(58) Field of Search ................................. 714/718, 815; 365/201

(56) References Cited

U.S. PATENT DOCUMENTS

| | | | |
|---|---|---|---|
| 4,890,270 | 12/1989 | Griffith | 368/113 |
| 5,099,196 | * 3/1992 | Longwell et al. . | |
| 5,222,066 | * 6/1993 | Grula et al. | 714/718 |
| 5,457,400 | 10/1995 | Ahmad et al. | 324/763 |
| 5,831,918 | 11/1998 | Merritt et al. | 365/201 |

* cited by examiner

Primary Examiner—Phung M. Chung
(74) Attorney, Agent, or Firm—George O. Saile; Stephen B. Ackerman

(57) ABSTRACT

In this invention a test circuit is formed on a high speed memory chip to allow performance testing of the memory chip mounted on a wafer, or after packaging, using a low speed tester. The test circuit creates a timed delay that is used to determine whether the operations of the memory chip can occur within the delay window of the timed delay. A timer circuit controls the amount of delay and which can be changed electronically through switches or fusible links. The tester provides an external clock from which a sync pulse is developed on the memory chip. The sync pulse is reshaped by the test circuit to produce the timed delay. The timed delay is less than the period of the tester clock, and allows testing of high speed memory chips on a wafer with a relatively slow speed tester. Memory chip yield is improved by repairing memory chips that fail the wafer level performance test. The wafer level performance testing increases the number of fast chips that are packaged and reduces the number of slow product that are tested at the package level.

13 Claims, 3 Drawing Sheets

US 6,237,115 B1

DESIGN FOR TESTABILITY IN VERY HIGH SPEED MEMORY

BACKGROUND OF THE INVENTION

1. Field of Invention

This invention is related to testing semiconductor memories and in particular testing very high speed memories.

2. Description of Related Art

The speed of today's computers places demands on the speed of memory chips to keep pace. As the memory chips get faster the ability to test them becomes more difficult and costly to develop new and faster testers. This is compounded by needing to probe the memory chips while still in a wafer form so that they can be sorted for performance. The impedance characteristics of the probes places additional limitations on the ability to test fast memory chips.

In U.S. Pat. No. 5,831,918 (Merritt et al.) an on chip timing circuit has an oscillator which is controlled by a test key that varies the frequency of the oscillator. This test circuit is used in stress testing a DRAM. In U.S. Pat. No. 5,457,400 (Ahmad et al.) an internal test circuit is provided with an additional conductive layer to power the test circuit. The test circuit is used to test DRAM's and other memory devices at the wafer level. In U.S. Pat. No. 4,890,270 (Griffith) a circuit is contained on a chip to determine the speed at which the particular chip operates. An external clock provides a bench mark against which to compare the operations of the chip can be compared.

In order to perform a performance test at the wafer level on high speed memory chips, fast testers and improved probes are required to apply high speed signals and detect the test results. This places a strain on resources to constantly keep up with the evolution of high speed memory chips. A means is needed that allows the memory chips to be tested for functional performance prior to sorting at the wafer level. Being able to do this improves through put, yield and reduces testing at higher package levels.

SUMMARY OF THE INVENTION

In this invention a test circuit is embedded on each memory chip on a wafer to perform performance testing at the wafer level on high performance memory chips. These high performance memory chips have speeds that are faster than the tester performing the tests. The test circuit embedded onto the memory chip provides a means by which a performance test of the high speed chips can be made. A tester clock signal and other memory signals are connected to the memory chip on a wafer through a set of probes. The test circuit receives a sync pulse from the memory chip and transforms the sync pulse into a delay window within which such operations as read and write must perform correctly. If the various memory operations perform within this delay window the memory chip is considered tested good at that particular performance. The delay window is less than a tester clock period and allows high speed memory chips to be tested for performance that is faster than the clock rate of the tester. Although this test circuit was created for wafer level testing it can also be used at higher level of packaging.

An input sync pulse synchronized with the tester clock is connected to the input of the test circuit. The input sync pulse is passed through to the output of the test circuit and at the same time connected to a timer circuit. The timer circuit passes the leading edge of the sync pulse quickly through to the output of the test circuit and delays the lagging edge of the input pulse. A timed delay between pulses is created at the output of the test circuit creating a delay window. This delay window is a result of the combination of the lagging edge of the input sync pulse and the delayed lagging edge of the input sync pulse from the output of timer circuit. The formed delay window is less than a tester clock period and is used to time various operations of the memory chip such as read and write. The amount of the timed delay can be adjusted by adjusting parameters of the timer circuit to provide a maximum permissible delay for the various memory operations. Chips that operate within the maximum permissible delay are tested good. Chips that fail the performance test are often caused by weak bits that degrade the performance and can be repaired to test good. These failures are not identified at wafer test with low frequency testing and by repair and retest can increase the yield at wafer test.

The test circuit and test method discussed herein provides a means to detect performance failures at the wafer level and repair those failures using redundant cells. The repair can allow the memory chip to pass the wafer level performance test by replacing weak cells, and can increase product tested good at the package level. The net result of the performance testing at the wafer level by the test circuit of this invention is that failed product can be repaired at a low level of assembly with fewer bad product passed on to package test, and package level yield can be higher resulting in fewer failures at field test.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
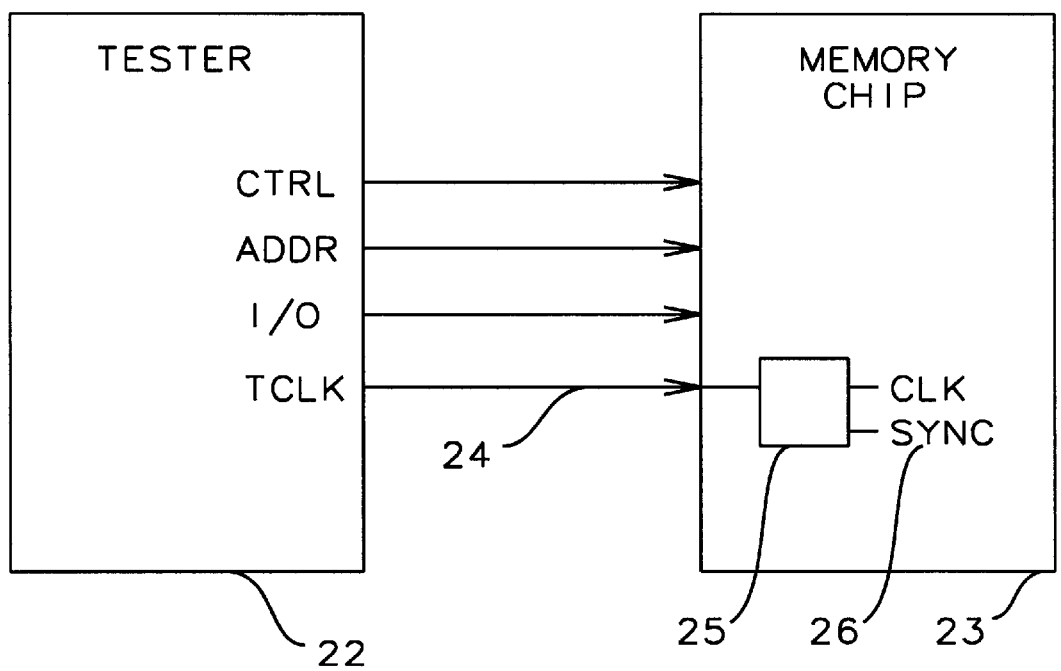
FIG. 1 is a schematic diagram of a tester connected to a memory chip.

In FIG. 1 is shown a tester 22 connected to a memory chip 23 by of a set of probes or other means represented by the tester clock connection 24. Other connections to the memory chip are for memory chip input and output signals, addressing and controls such as Cs (column select), WE (write enable), RAS (row access select), and CAS (column address select). The tester clock 24 is connected to a memory clock circuit 25 from which is produced a sync pulse 26 which is used to connect to a test circuit input 10 in FIG. 2a.

Figure 2A:
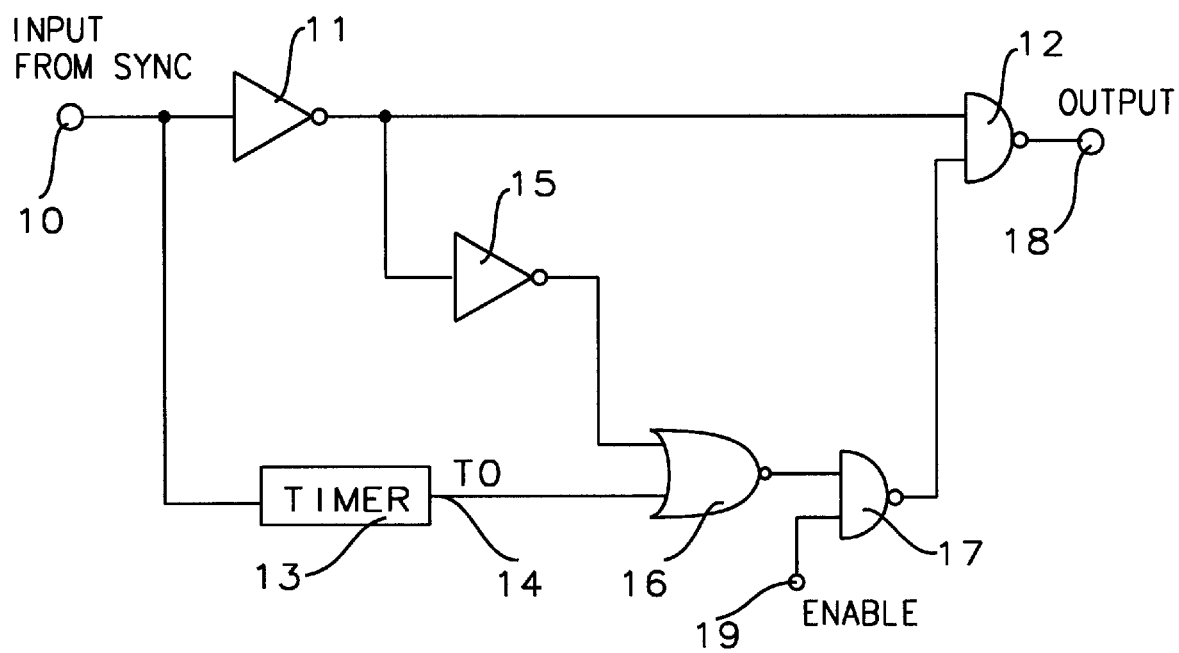
FIG. 2a is a schematic diagram of the test circuit of this invention.

In FIG. 2a is shown the test circuit of this invention. A circuit input 10 is connected to a first inverter 11 and on to a first input of a first NAND circuit 12 producing the output 18 of the test circuit. Connected to the input 10 is a timer circuit 13 producing a timed output "T0" 14. The output 14 of the timer circuit 13 is connected to an input of a NOR circuit 16. A second input to the NOR circuit 16 is connected from the output of the first inverter 11 through a second inverter 15. The output of the NOR circuit 16 is connected to a first input of a second NAND 17. The second input to the second NAND circuit is connected to an enable input 19. An enable signal from internal to the memory chip is connected to the enable input 19. The output of the second NAND circuit 17 is connected to the second input of the first NAND circuit 12.

Continuing to refer to FIG. 2a, the sync pulse 26 is connected to the test circuit input 10. The sync pulse is passed to the first NAND circuit 12 at the output of the test circuit through the first inverter 11. At the same time the sync pulse is connected to the timer circuit 13. The sync pulse at the output of the first inverter 11 is connected to a NOR circuit 16 through inverter 15. This provides a positive signal to the input of the NOR circuit 16 until the leading edge of the sync pulse gets through the timer circuit 13. The output of the timer circuit 13 is connected to the NOR circuit 16, and the timer circuit 13 passes to the NOR circuit 16 the leading edge of the sync pulse from the test circuit input 10 before the sync pulse from the second inverter 15 goes away. This keeps a positive signal on the second input of the first NAND circuit 12 at the output of the test circuit, and allows the test pulse to be passed to the test circuit output 18 by the first NAND circuit 12. The lagging edge of the sync pulse forms the leading edge of the timed delay window of the test circuit at the output of the test circuit 18. After the lagging edge of the sync pulse at the input 10 is delayed through the timer 13, both inputs to the NOR circuit 16 are low putting a low signal at the input to the first NAND circuit 12. This drives the output of the first NAND circuit 12 high and creates the lagging edge of the timed delay window of the test circuit. The timed delay window at the output 18 of the test circuit is used to time the operations of the memory chip under test and is the delay from the lagging edge of the input sync pulse to the delayed lagging edge of the input sync pulse created by the timer 13.

Figure 2B:
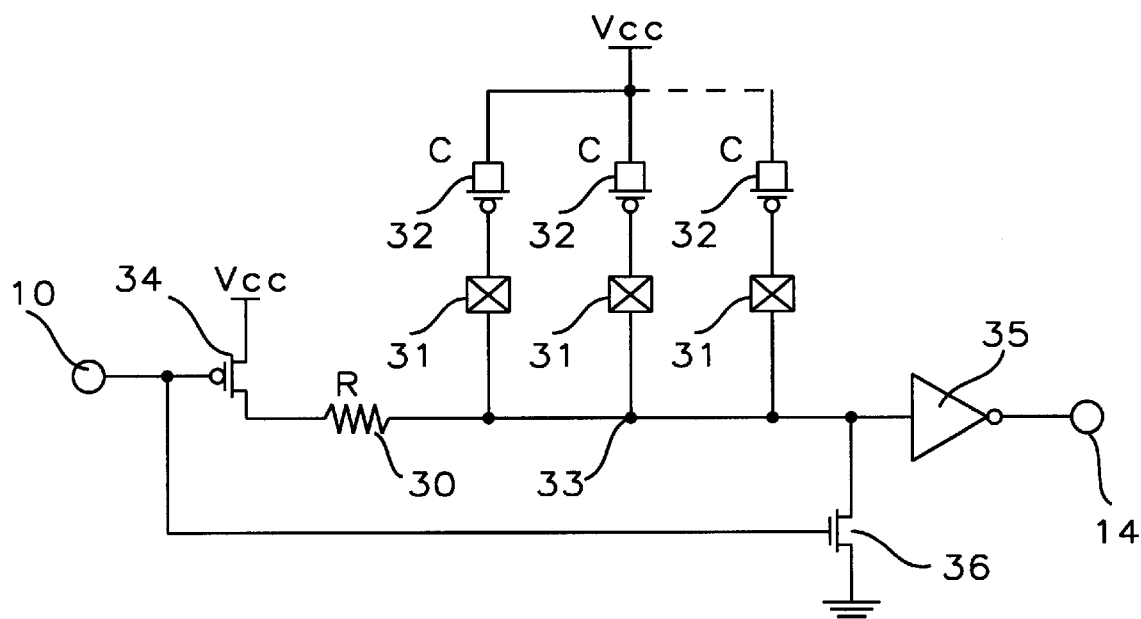
FIG. 2b is a schematic of a timer circuit included in the test circuit.

Referring to FIG. 2b, a possible timer circuit is shown. This is an RC network having a series resistor 30 and a number of capacitors 32. The amount of delay is controlled by selecting or deselecting the capacitors 32 by means of switches 31. The switches 31 can be controlled by fuses or electronically by test mode. A sync pulse 41 is applied to the input of the test circuit 10 and the input of the of the timer circuit 13. A low power P-channel transistor 34 connects the input sync pulse to the timing network which comprises a resistor 30 of value R and capacitor devices 32 of value C. The capacitor devices 32 are constructed of P-channel transistors with source and drain connected together and to Vcc, and with the gate connected to the delay network node 33 through switches 31. Switches 31 select and deselect the capacitor devices to produce a capacitance necessary to provide the required delay of the lagging edge of the timer 13 signal T0 14. The output 14 of the timer circuit 13 is buffered from the delay network 30 32 by inverter 35. A large N-channel transistor is connected to node 33 of the delay network to quickly pull down node 33 in response to a rising pulse at input 10 of the timer circuit which allows the leading edge of the timer output 14 to quickly rise in response to the raising input signal 10.

Continuing to refer to FIG. 2b, when the input 10 is low, node 33 is high and the capacitor devices 32 are off and have a low capacitance value. When the leading edge of the sync signal at input 10 goes high, node 33 quickly goes low because of the low capacitance, and the output 14 of the inverter circuit 35 goes high producing a leading edge of the timer signal 44 in FIG. 3. When the sync pulse at input 10 goes low, transistor 36 is turned off, node 33 slowly raises because of the time constant of the RC network 30 32, and the output 14 of the inverter 35 stays high until the voltage on node 33 exceeds the threshold of input of the inverter 35. When the output of the inverter 35 goes low, the lagging edge of the timer signal 44 is created. The width of the timer signal 44 can be adjusted by selecting or deselecting capacitors 32. The time from the leading edge to the lagging edge of the timer signal 44 is used to set the timing "t" of the delay window 48 used to time the functional operation of the memory chip while under test. This allows the tester clock that is applied to the chip to be slower than the maximum rate at which the memory chip is specified to perform, yet provide a timing test of the memory chip to check for functional performance specified at a clock faster than that of the tester.

Figure 3:
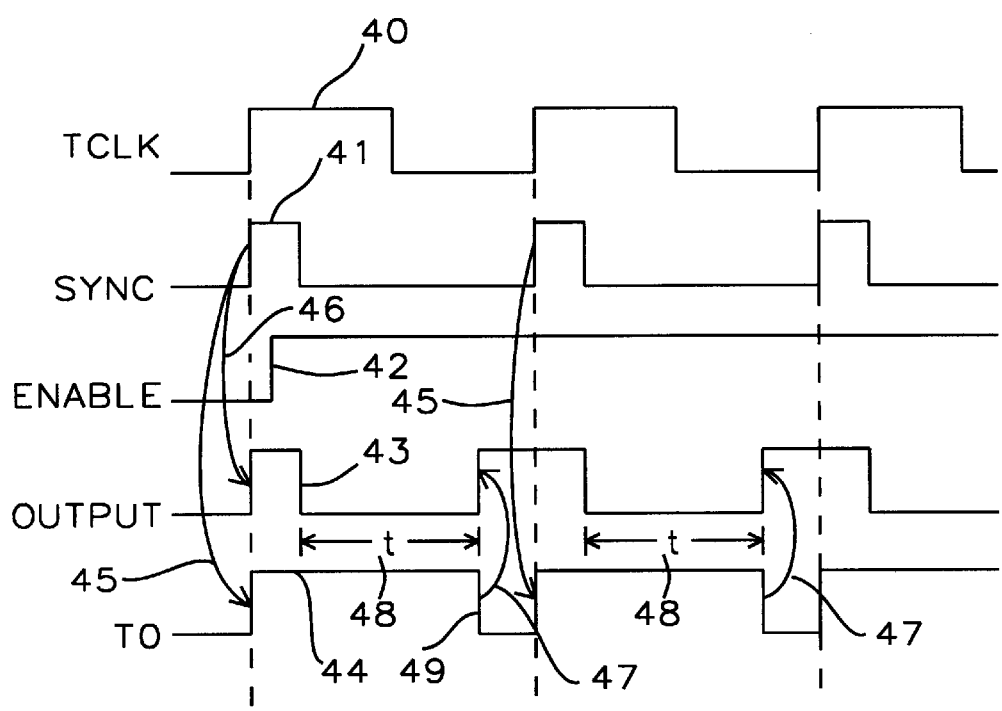
FIG. 3 is a timing diagram of waveforms important to the operation of the test circuit.

Referring to FIG. 3, a set of waveforms is shown for the test circuit. A test circuit input sync signal 41 is shown synchronized to an external tester clock 40. The sync signal 41 is developed internal to the memory chip and synchronous to the tester clock 40. A test enable pulse 42 becomes active within the timing of the input sync signal 41. The enable signal 42, which is normally controlled off, is controlled on by the test mode and can be enabled for either read, write, or both. Initially the output 43 of the test circuit follows the input signal 41 as indicated by the "relational" arrow 46. At the same time the timer circuit output "T0" 44 goes high as indicated by the "relational" arrow 45. The timer circuit output T0 44 remains high for a time that is longer than the input sync signal 41 and shorter than the period of the tester clock. When the lagging edge of the output of the timer circuit 44 goes low, the test circuit output signal 43 is forced high as indicated by the "relational" arrow 47. The timed delay window "t" 48 is formed in the output signal 43 of the test circuit between the lagging edge of the input sync pulse 41 and the delayed lagging edge of the input sync pulse resulting from the timer circuit 49. This delay window "t" 48 is connected to the timing controls of the memory chip and is used to determine if the operations of the memory chip can perform within the timed delay window 48. The delay window 48 is less that the cycle time of the tester clock 40 and provides a means by which a fast memory chip can be performance tested using a relatively slow tester.

Figure 4:
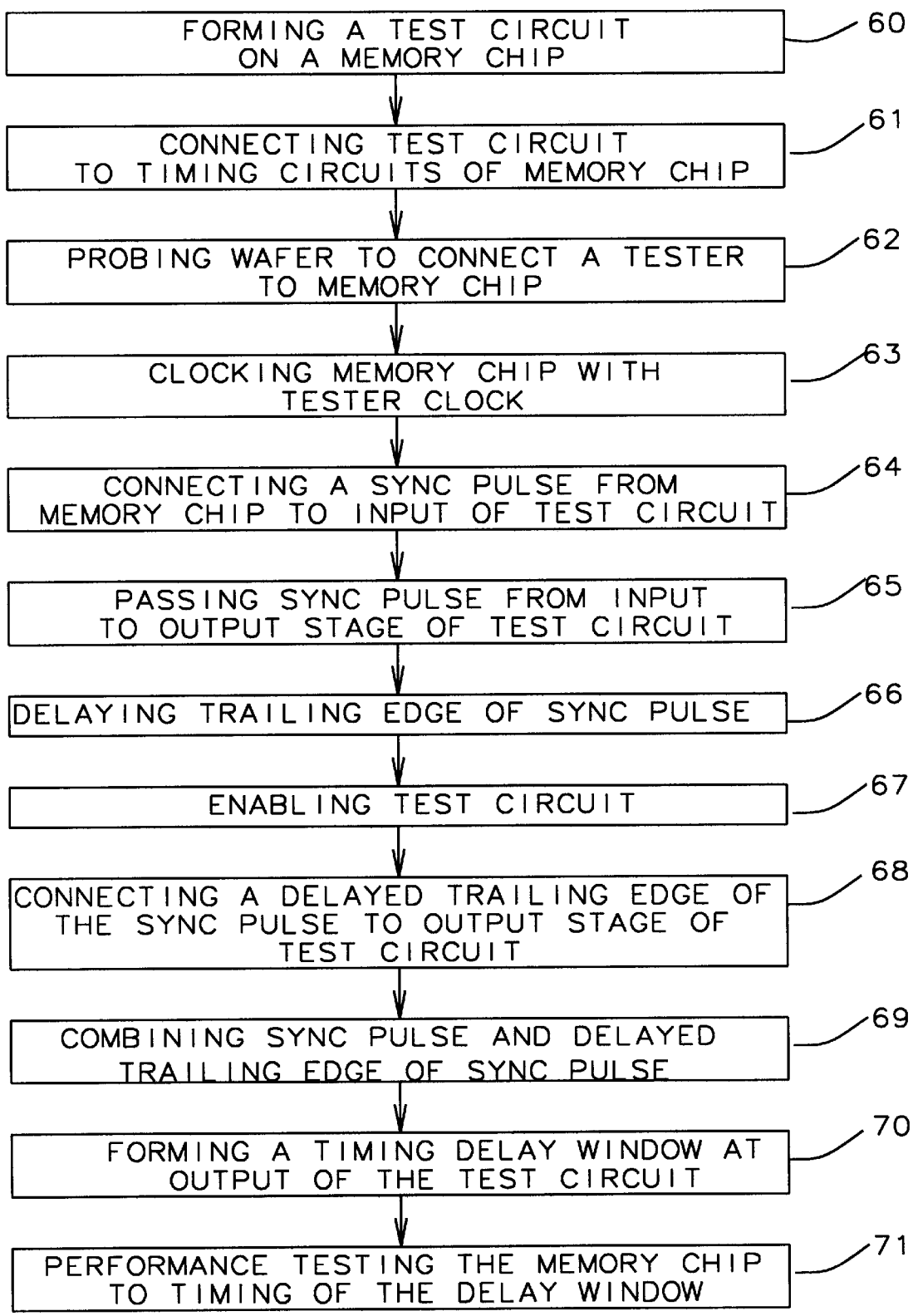
FIG. 4 is a flow diagram of the method to performance test memory chips using the test circuit of this invention.

In FIG. 4 a method is shown that produces a timed delay window for testing the performance of a high speed memory chip using a slower speed tester and a test circuit formed on a memory chip 60. The test circuit is connected to the timing circuits of the memory chip 61. A wafer is probed, connecting a tester to the memory chip 62. The memory chip is clocked using the tester clock 63. A sync pulse is connected to the input of the test circuit from the memory chip 64, and the sync pulse is passed from the input stage of the test circuit to the output stage of the test circuit 65. The trailing edge of the sync is delayed in a timer of the test circuit 66. The test circuit is enabled 67 allowing a delayed trailing edge of the sync pulse to be connected to the output stage of the test circuit 68. The sync pulse and the delayed trailing edge of the sync pulse are combined in the output stage of the test circuit 69, and a timing delay window is formed at the output of the test circuit 70. The timing delay window is the delay between the trailing edge of the clocked pulse and the delayed trailing edge of the clocked pulse. The delay of the timing delay window can be changed by adjusting the amount of the capacitance 32 connected in the RC delay network 30 32 in the timer 13 shown in FIG. 2b. The memory chip is performance tested using the timing window of the test circuit 71 to control the timing of the memory chip and using a relatively slow tester to condition the memory chip and monitor the results performance tests.

Being able to performance test a memory chip at the wafer level allows the failing chips to be repaired and in turn increases the wafer level yield. With better tested product being passed on to the package level, the package level testing has a better yield and fewer parts having the added cost of packaging are thrown away.

While the invention has been particularly shown and described with reference to preferred embodiments thereof, it will be understood by those skilled in the art that various changes in form and details may be made without departing from the spirit and scope of the invention.

What is claimed is:

1. A test circuit for testing high speed memory, comprising:
    a) a test circuit embedded on a memory chip,
    b) said test circuit modifying a sync pulse on the memory chip to produce a timing delay window,
    c) said timing delay window connected to said memory chip to limit an amount of time to perform read and write operations in said memory chip.

2. The test circuit of claim 1, wherein a delay within said test circuit can be adjusted by varying a capacitance of an RC network to change the amount of time in said delay window to perform said read and write operations.

3. The test circuit of claim 1, wherein said sync pulse is a repetitive pulse reoccurring at the rate of set by a tester clock.

4. The test circuit of claim 3, wherein said tester clock is slower than an operating rate of said memory chip.

5. A test circuit to adapt a slow tester to a high speed memory chip, comprising:
    a) an input and an output of a test circuit on a memory chip,
    b) said input of said test circuit connected to a memory sync pulse,
    c) said output of said test circuit connected to timing control of said memory chip,
    d) a timer circuit connected to said input produces a delay of a trailing edge of said sync pulse, and
    e) said delay of said trailing edge of said sync pulse combined with said sync pulse produces a timing for operations of said memory chip.

6. The test circuit of claim 5, wherein the delay of said trailing edge of said sync pulse can be programmed to produce a timing for operations of said memory chip that is less than a clock period of said tester by selecting a capacitance of an RC network.

7. The test circuit of claim 5, wherein said tester signal is slower than the timing needed to test a high speed memory chip.

8. A method to perform high speed memory testing with a slow speed tester, comprising:
    a) forming a test circuit on a memory chip on a wafer,
    b) connecting said test circuit to timing circuits of said memory chip,
    c) probing said wafer to connect a tester to said memory chip,
    d) clocking memory chip with tester clock,
    e) connecting a sync pulse from memory chip to input of said test circuit,
    f) passing said sync pulse from input to output stage of said test circuit,
    g) delaying trailing edge of said sync pulse,
    h) enabling test circuit,
    i) connecting said delayed trailing edge of said sync pulse to output stage of said test circuit,
    j) combining said sync pulse and said delayed trailing edge of said sync pulse,
    k) forming a timing delay window at the output of said test circuit, and
    l) testing memory chip to said timing delay window.

9. The method of claim 8, wherein probing said wafer can be replaced with connecting to a memory module to test a packaged memory chip.

10. The method of claim 8, wherein delaying said trailing edge of said sync pulse is less than the period of the tester clock.

11. The method of claim 8, wherein delaying said trailing edge of said sync pulse forms a leading edge of said output of the test circuit of a next test cycle.

12. The method of claim 8, wherein delaying said trailing edge of said sync pulse is done in a timer circuit which passes a leading edge quickly and delays said lagging edge.

13. The method of claim 8, wherein delaying said trailing edge of said sync pulse is done in an RC delay network of a timer circuit where the delay can be changed by selecting a different amount of capacitance.

* * * * *